United States Patent
Castagnetti et al.

(10) Patent No.: US 7,042,747 B1
(45) Date of Patent: May 9, 2006

(54) TERNARY CAM BITCELLS

(75) Inventors: Ruggero Castagnetti, Menlo Park, CA (US); Ramnath Venkatraman, San Jose, CA (US); Joseph E. Glenn, Eden Prairie, MN (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 11/041,094

(22) Filed: Jan. 19, 2005

(51) Int. Cl.
*G11C 15/00* (2006.01)
(52) U.S. Cl. .................................... 365/49; 365/189.07
(58) Field of Classification Search .................. 365/49, 365/189.07
See application file for complete search history.

(56) References Cited

U.S. PATENT DOCUMENTS 6,807,077 B1 * 10/2004 Noda et al. .................... 365/49
2004/0114411 A1 * 6/2004 Noda et al. .................... 365/49
2004/0223353 A1 * 11/2004 Kim et al. ..................... 365/49

* cited by examiner

*Primary Examiner*—Huan Hoang
(74) *Attorney, Agent, or Firm*—Yee & Associates, P.C.

(57) ABSTRACT

Two new ternary CAM bitcell design options are presented that provide compact layout solutions while maximizing matchline channels routing through the cells. In both layouts, the first inventive layout, an asymmetric layout of the 6T-SRAM bitcell is used to improve ease of layout, density, and performance of ternary CAM cells. In the second inventive layout, n-type diffusions for the SRAM bitcell and the comparison circuit are separated, creating a bitcell having a more even cell aspect ratio.

20 Claims, 12 Drawing Sheets

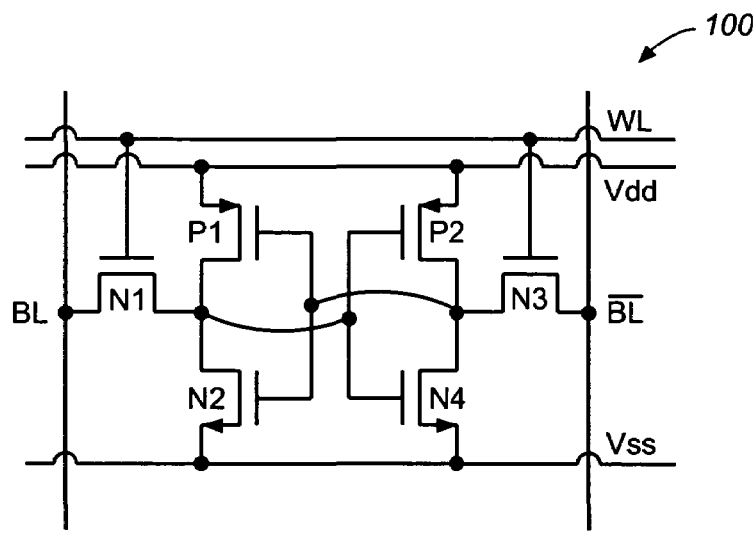
FIG._1 (PRIOR ART)
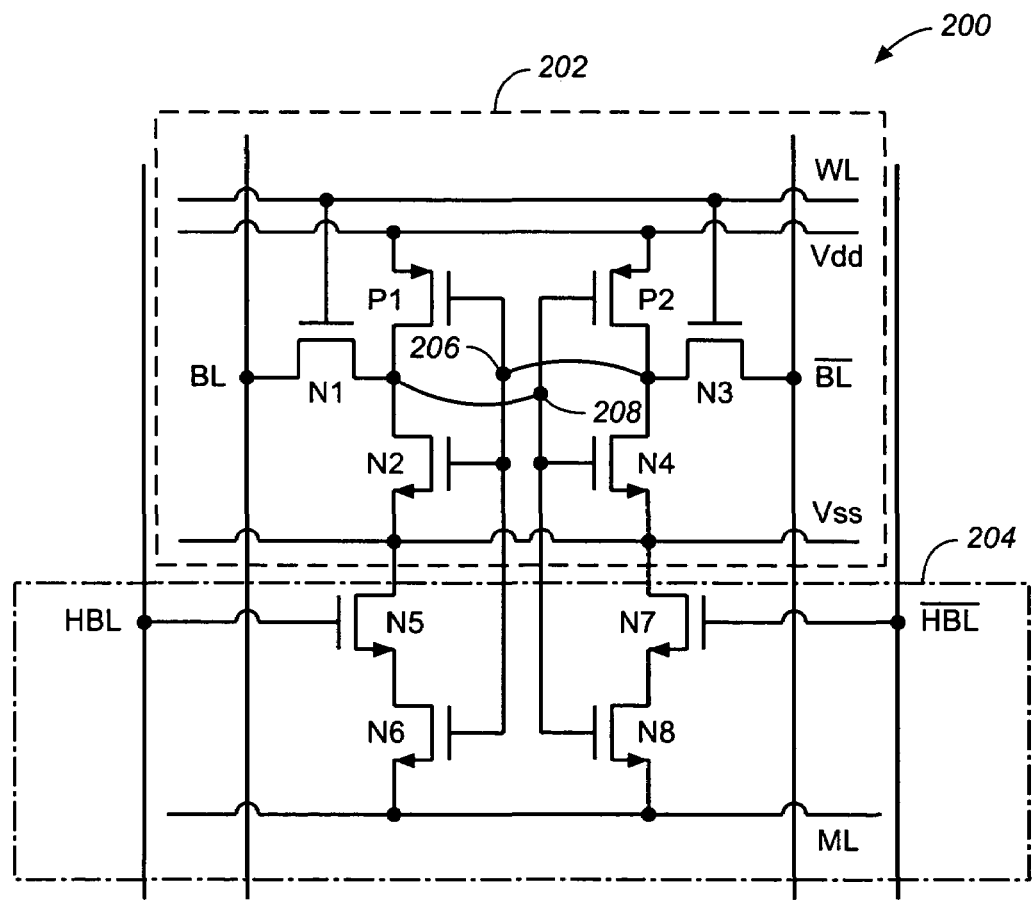
FIG._2 (PRIOR ART)

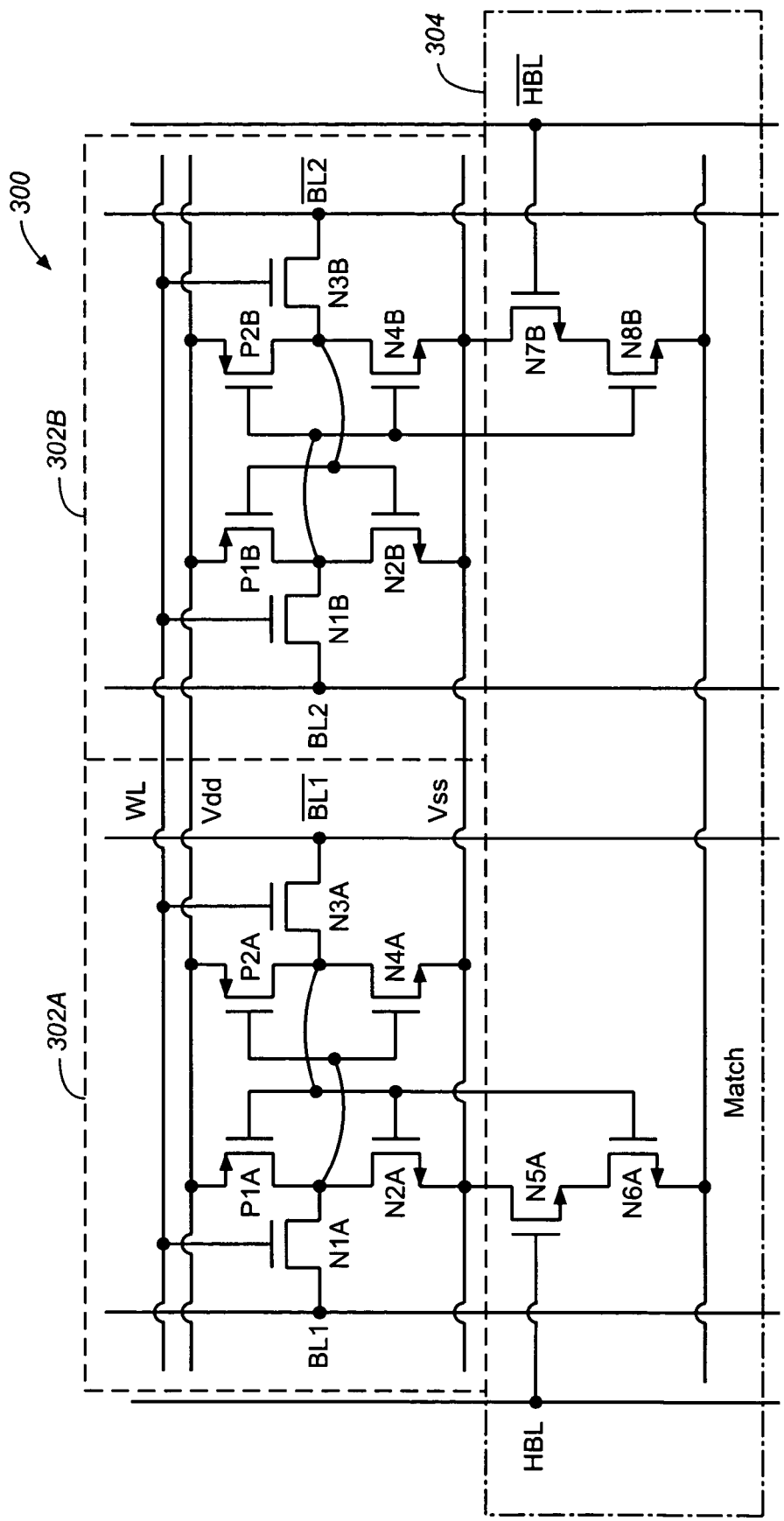
FIG._3 (PRIOR ART)

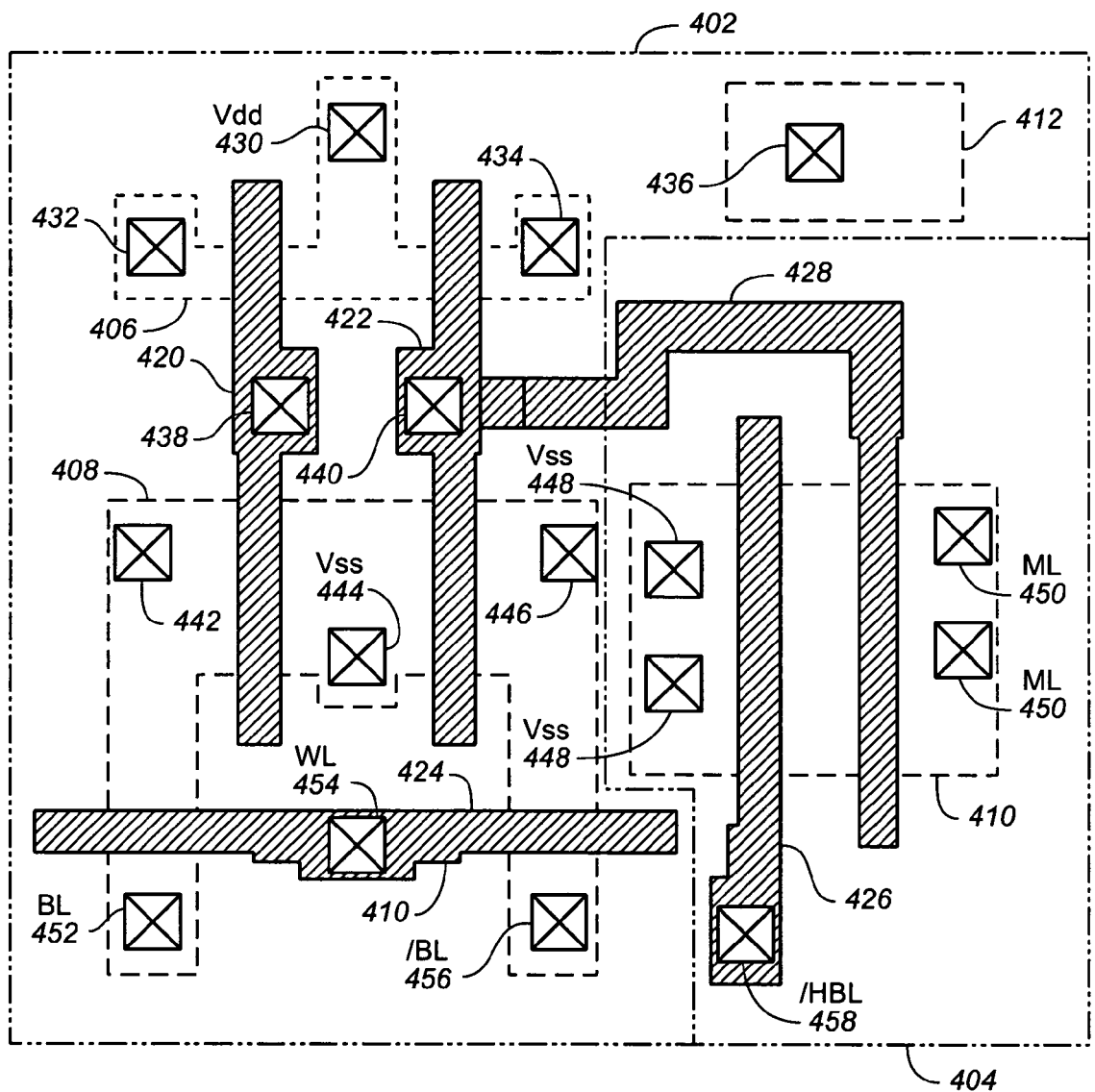
FIG._4A *(PRIOR ART)*

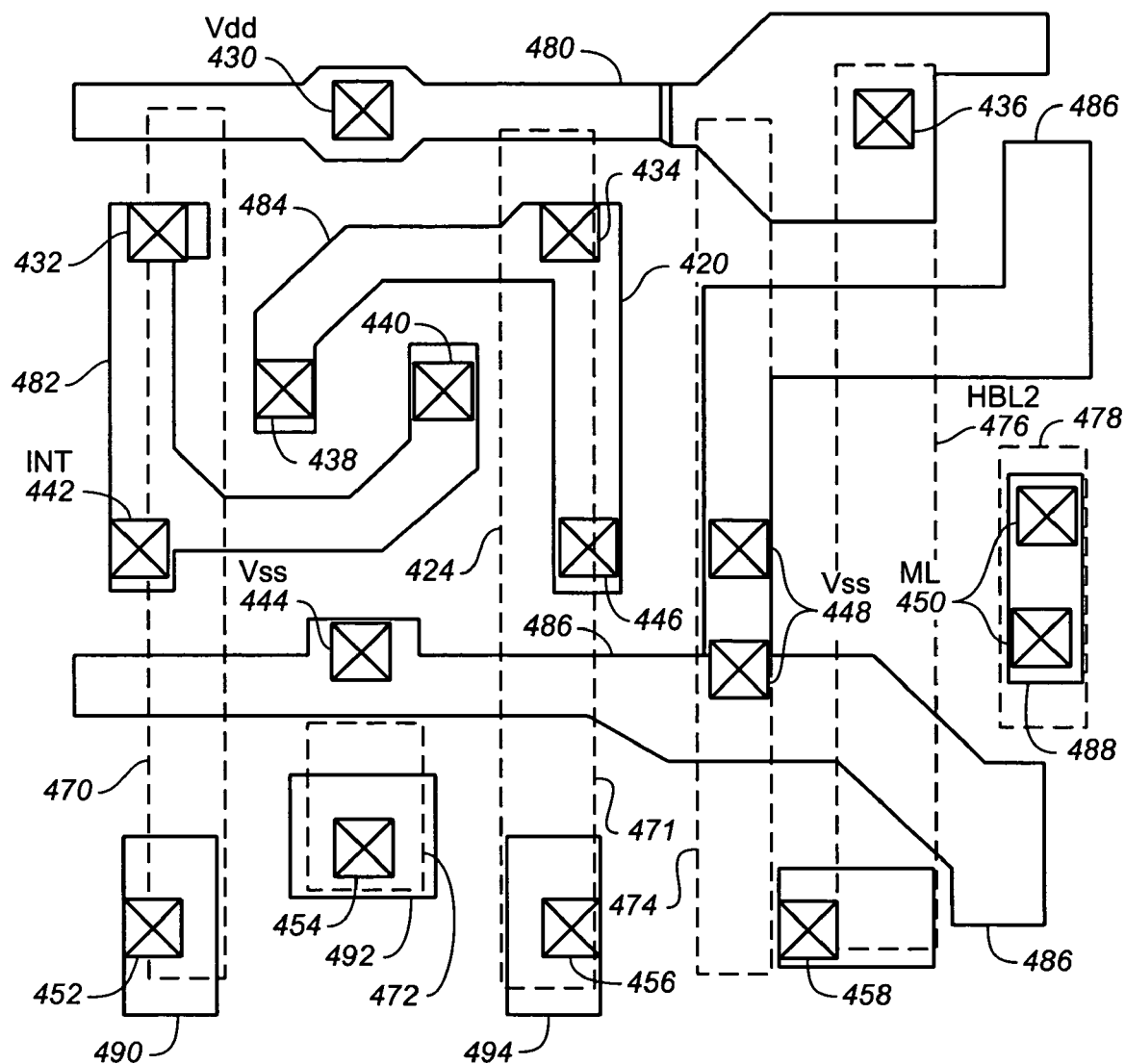
FIG._4B (PRIOR ART)

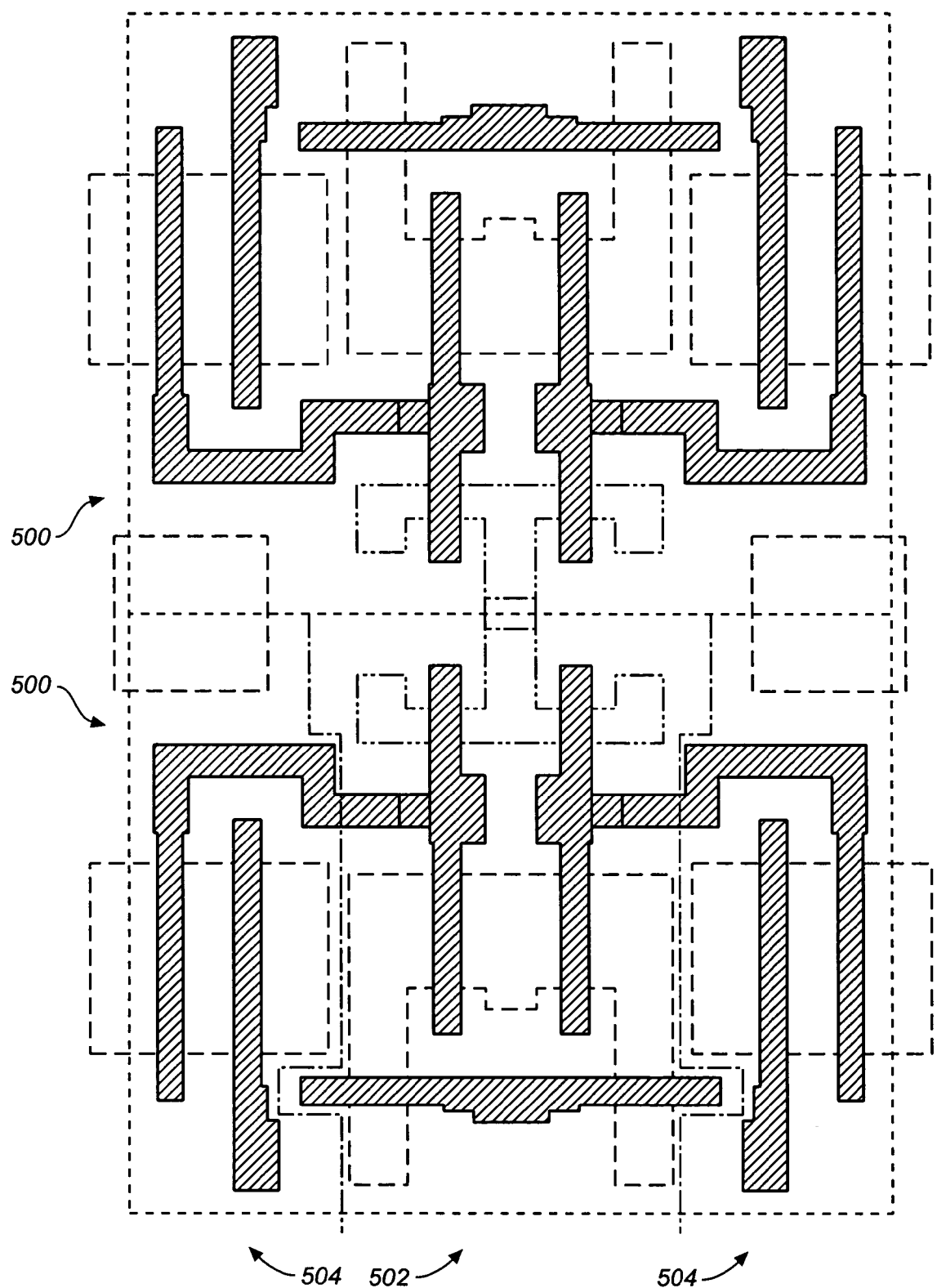
FIG._5A *(PRIOR ART)*

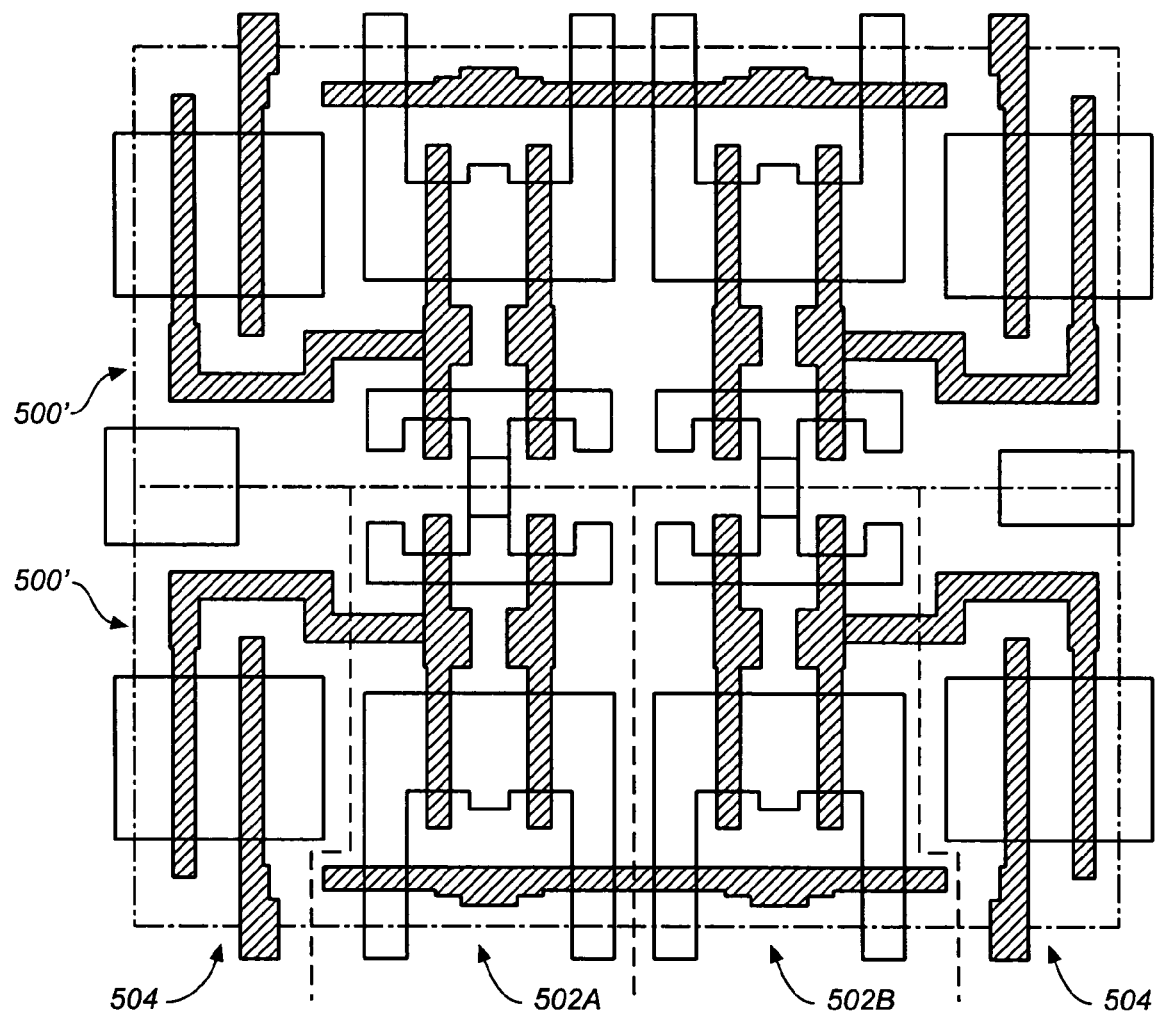
FIG._5B (PRIOR ART)

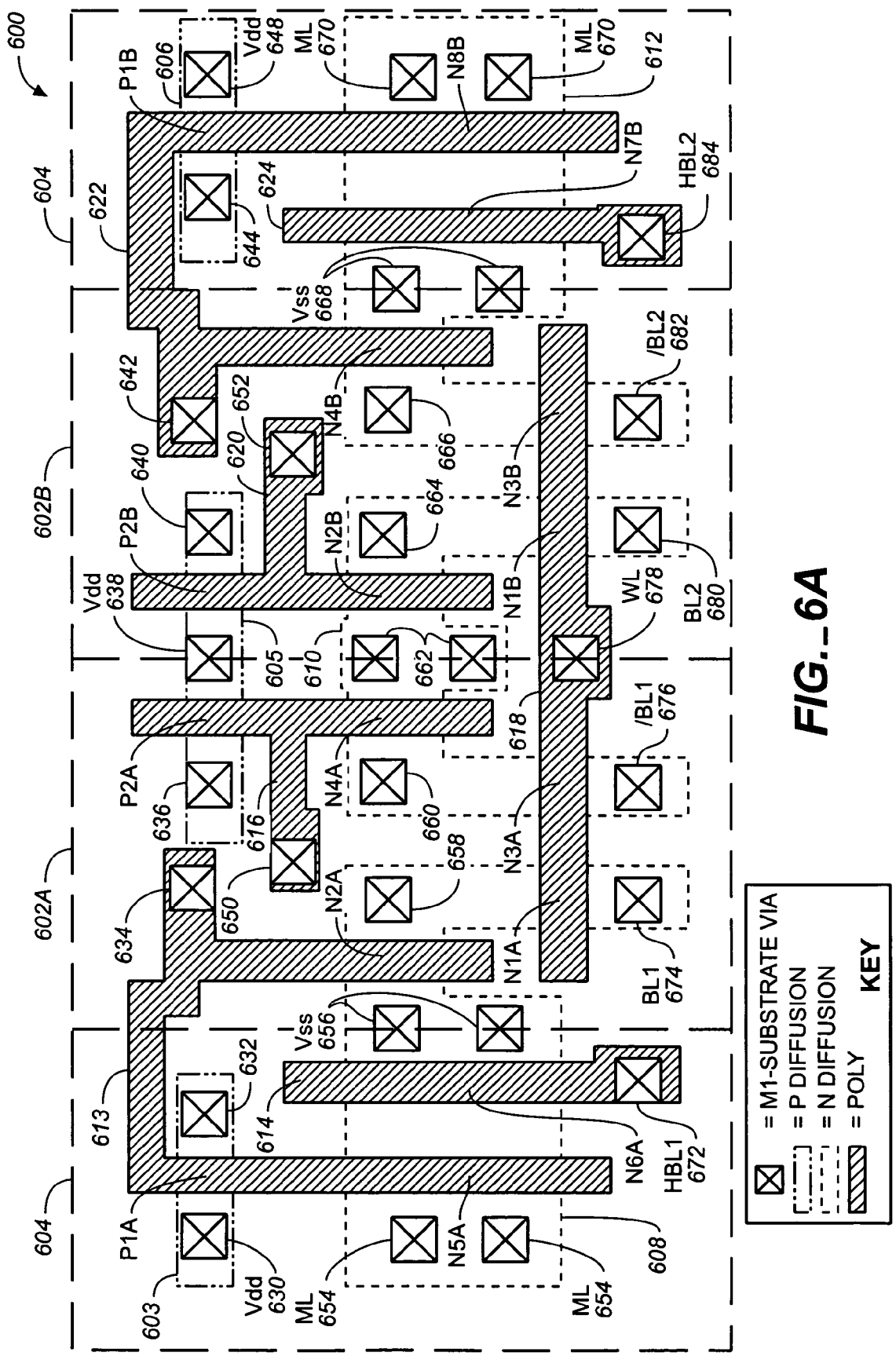
FIG._6A

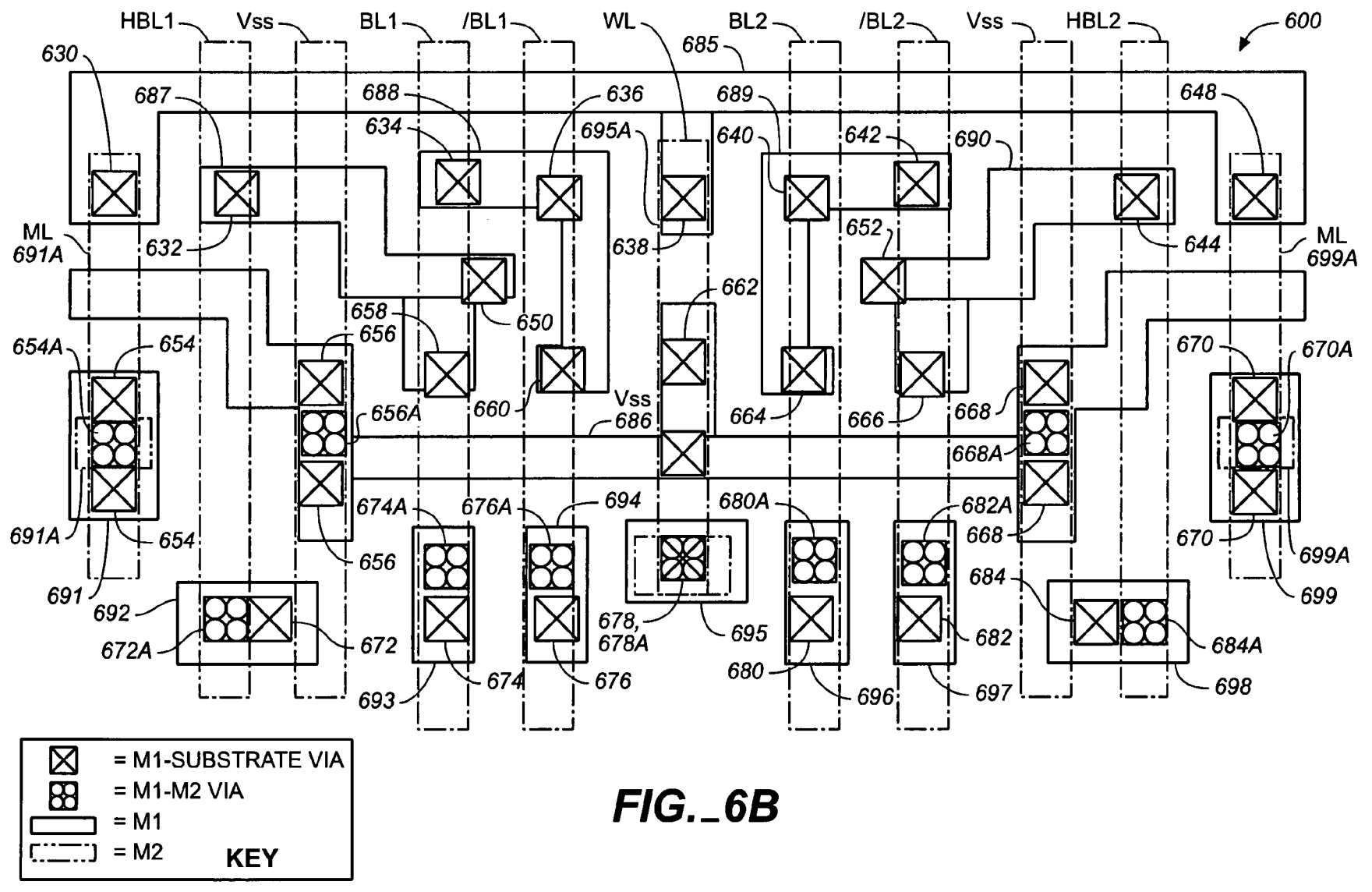

FIG._6B

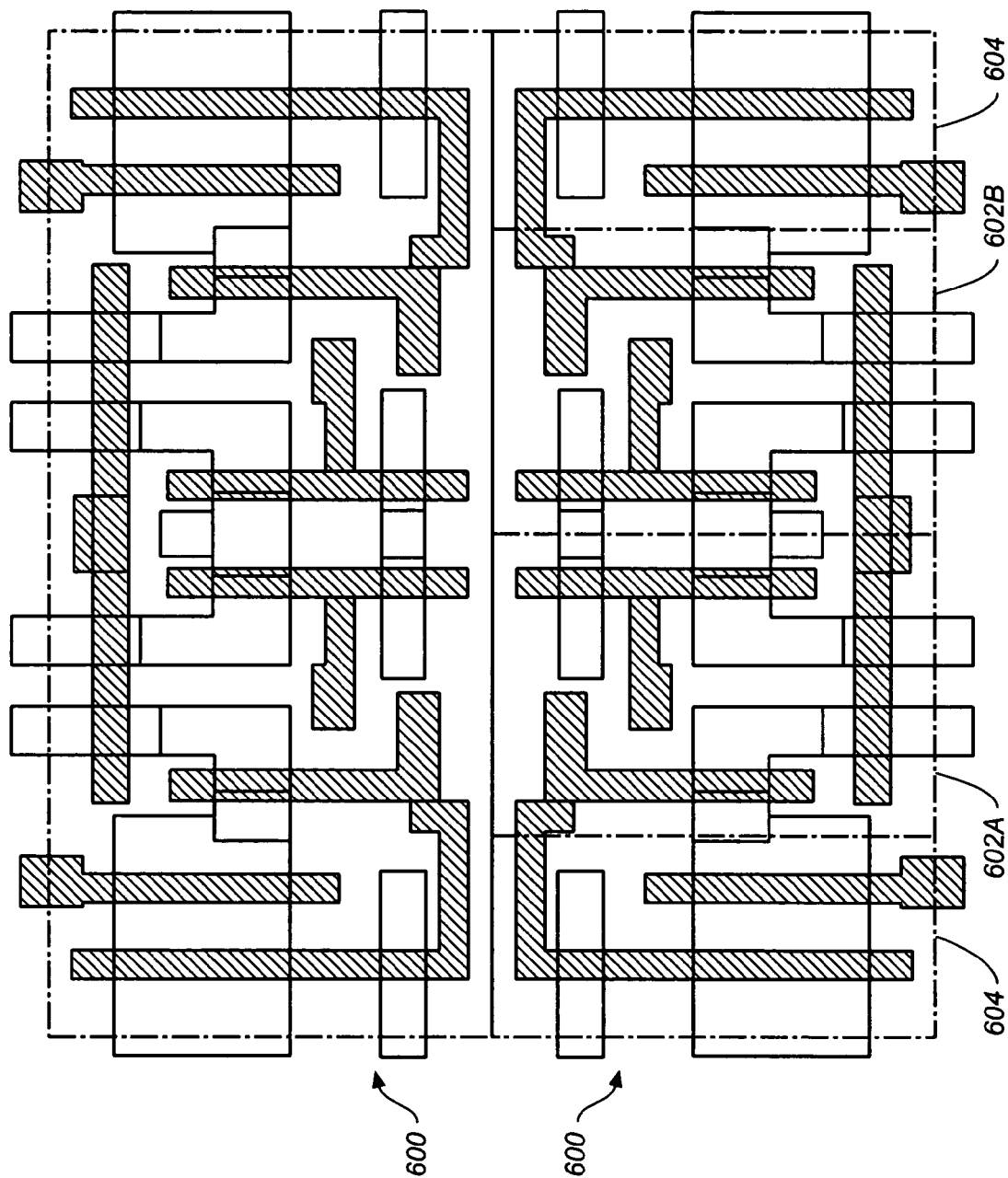
FIG._6C

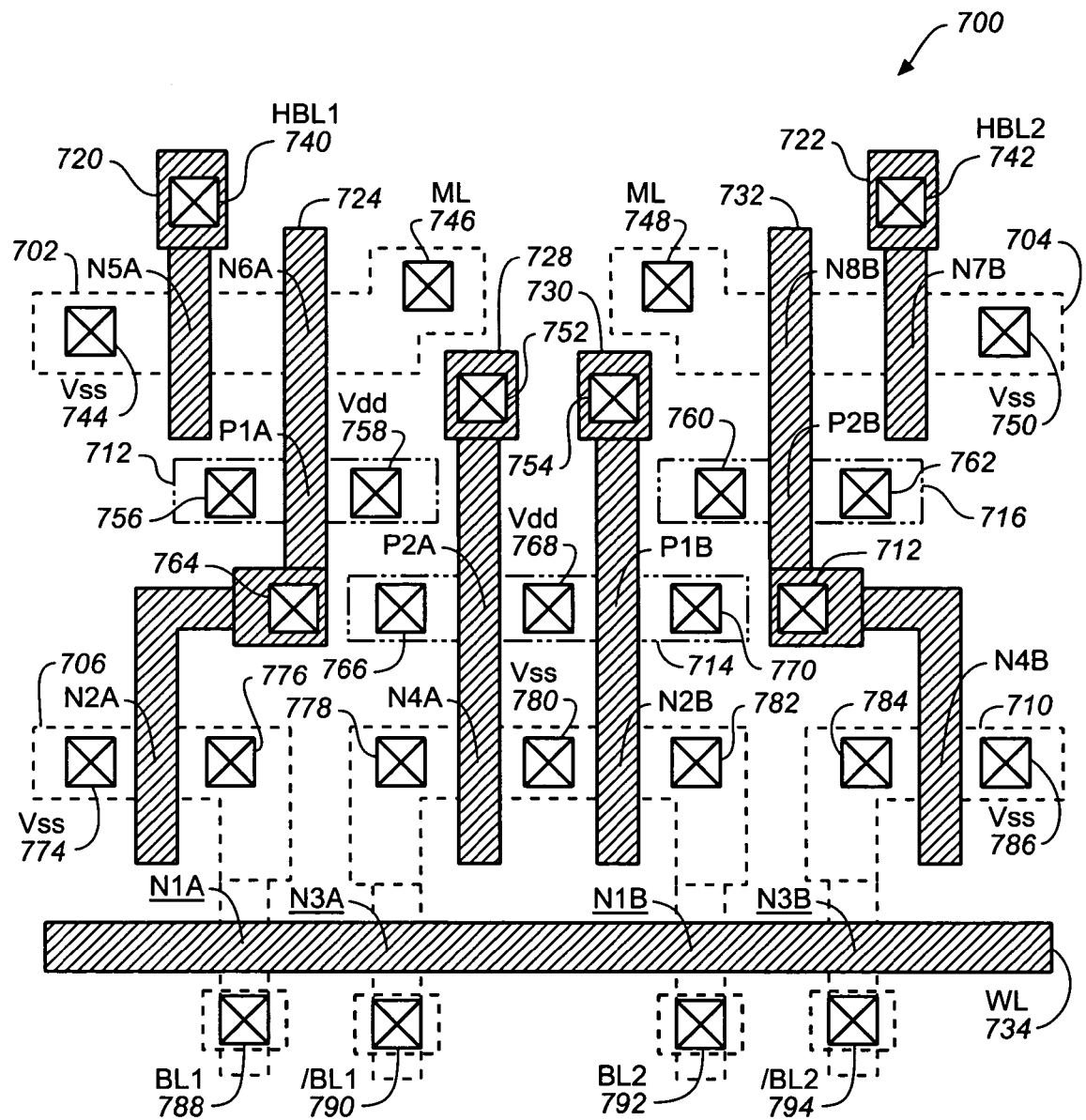
FIG._7A

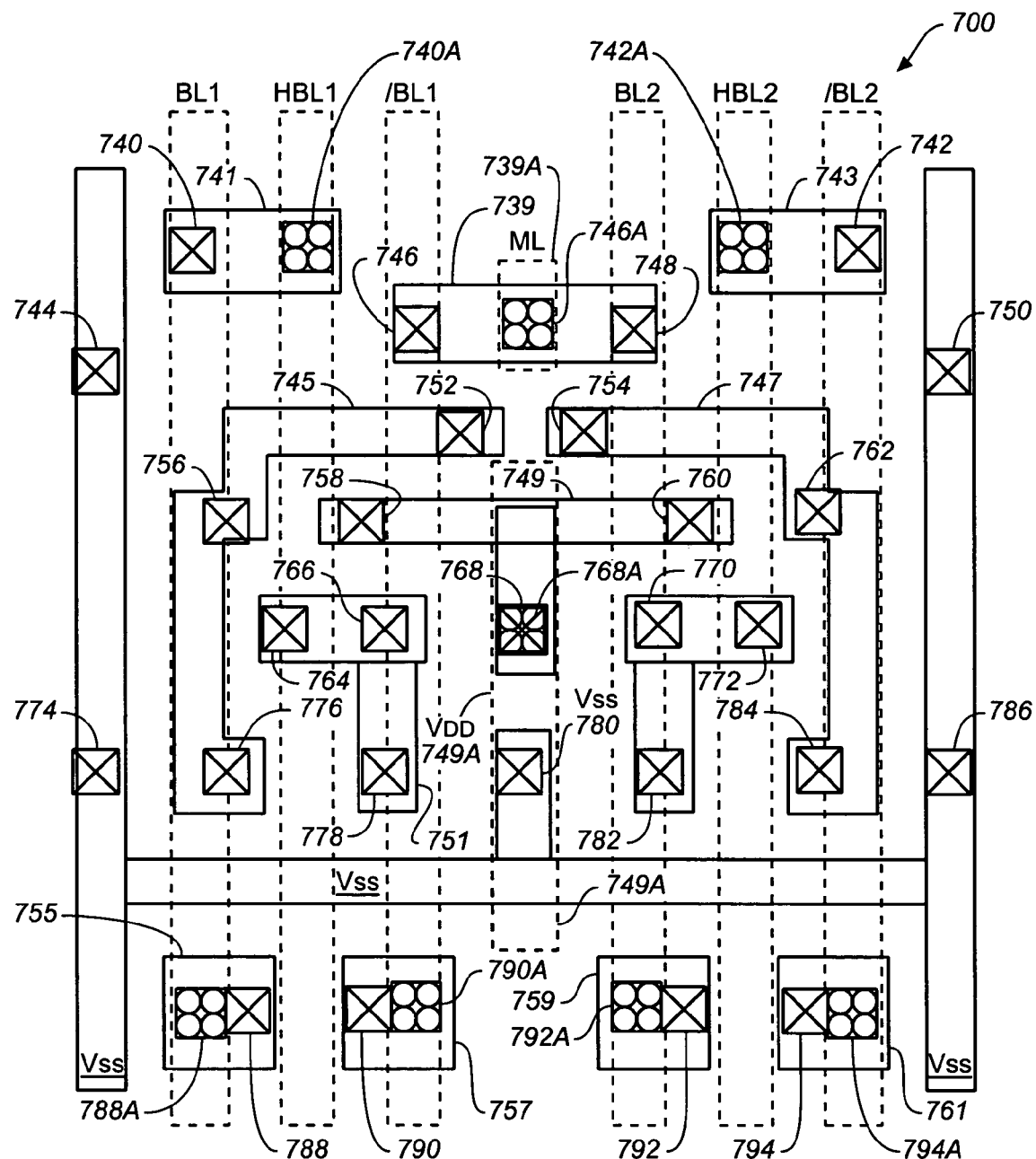
FIG._7B

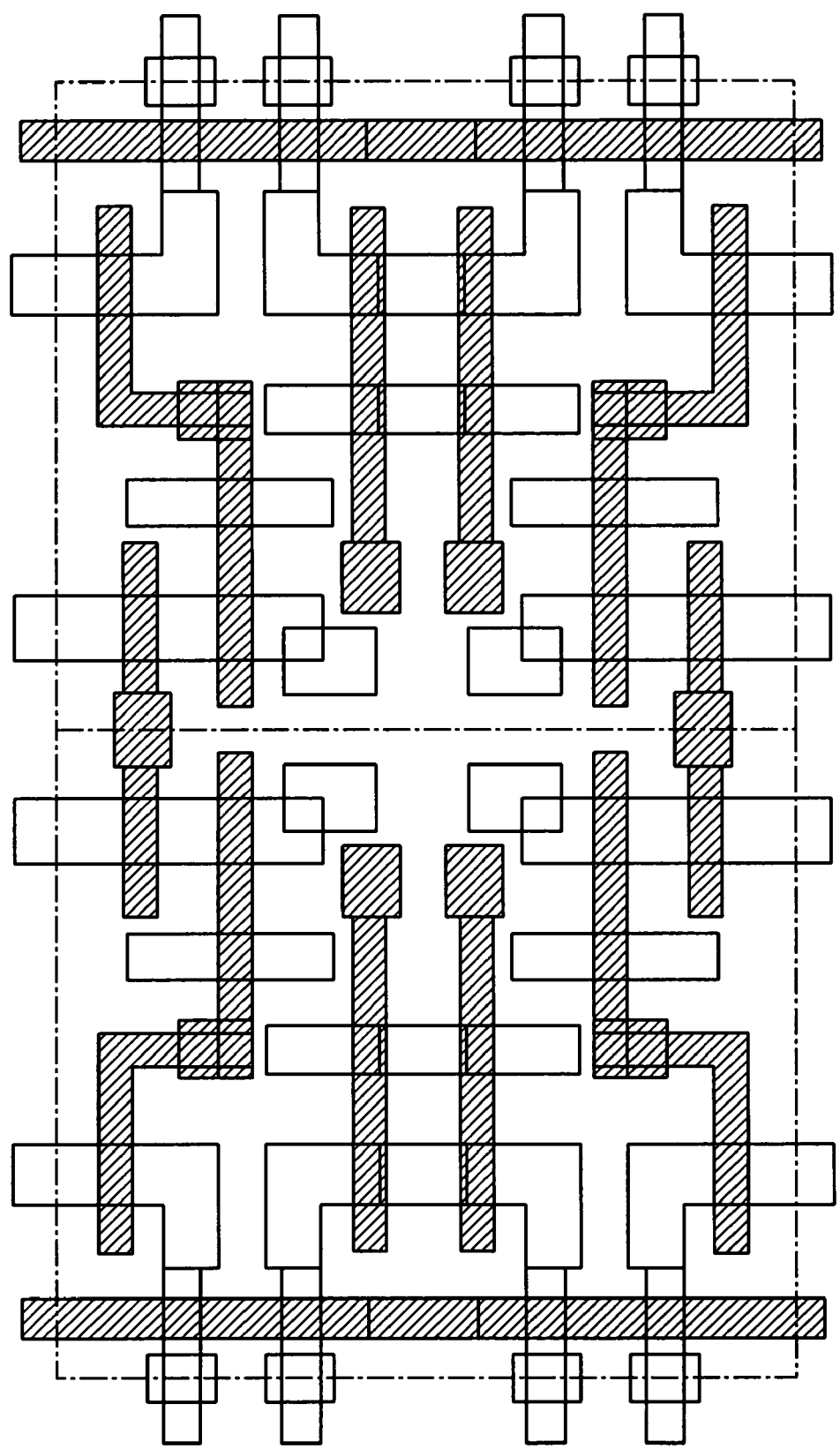
FIG._7C

TERNARY CAM BITCELLS

BACKGROUND OF THE INVENTION

1. Technical Field

The present invention is directed toward a layout for ternary CAM bitcells that allows a greater density in an array of CAM bitcells.

2. Description of the Related Art

Content addressable memory (CAM) is a specialized type of memory. Unlike random access memory (RAM), where one uses a given address to randomly access the data stored there, CAM has the capability to supply an address, based on the value stored at or associated with the address. Additionally, an array of CAM cells will have built-in comparison circuitry for every cell of hardware memory. This allows a massively parallel search, where every bit in memory is searched simultaneously. Consequently, the hardware can provide an extremely fast search of a large set of information.

This makes CAMs suitable for applications where fast searches are required, such as imaging, voice recognition, and networking applications. In networking applications, for instance, CAMs are used to control the traffic of packets on the Internet and make sure that the proper information arrives at its destination as specified in the header (e.g. an URL or email address). In many network systems, stand-alone CAM products are used, which then interface, for example, with an application specific integrated circuit (ASIC) to provide the proper function. However, in order to reduce system cost, power consumption and improve performance, there is a desire to embed CAM functionality within an ASIC as a system-on-chip solution. Therefore, there is a strong need to develop high-density, high-performance CAM bitcells. Present layouts do not meet this need, for reasons that will be discussed.

Short Lesson in CAM Circuitry

CAMs are typically derived from a high-density 6T-SRAM bitcell, so an understanding of the circuitry of a bitcell can aid in understanding the complexities of a CAM array. FIG. 1 discloses a circuit diagram of a 6T-SRAM bitcell 100. The bitcell 100 consists of two PMOS transistors P1, P2, four NMOS transistors N1, N2, N3, N4, two bitlines BL, /BL for signal detection, one wordline WL used for reading and writing data to the cell, and the power supplies Vdd, Vss. Bitlines BL, /BL (read as bar BL and shown with an overline in the figures) carry complementary values, i.e., one is high and one is low. When the cell is written, it will contain a single bit of information, e.g., BL=low, /BL=high gives a value of zero while BL=high, /BL=low gives a value of one. The data is stored through two, cross-coupled inverters, with this configuration allowing the information to be maintained without the need for constantly refreshing, as is the case in DRAM. Although other bitcell circuits have been proposed and used, the 6T-SRAM cell shown is the one most commonly used in the industry for bitcells, especially for high-density applications.

Two types of CAM bitcells can be formed from this 6T SRAM bitcell: binary and ternary, which will be explained along with their structures. FIG. 2 discloses a binary CAM (BCAM) bitcell 200. BCAM bitcell 200 will not only store the bit of information in the SRAM structure above, here denoted 202, but also contains two complementary hitlines HBL, /HBL that provide the data for comparison, comparison circuit 204, composed of four additional NMOS transistors N5, N6, N7, N8 that compare the cell data to the hitlines HBL, /HBL, and a matchline ML that indicates if there is a match or not. Because the bitcell, like the SRAM cell above, can have a value of only zero or one, a comparison between the value carried in the bitcell and the value carried in the hitlines can only result in two answers: match or no-match.

More recently, ternary CAM (TCAM) bitcells have been developed that can provide an additional option, an "I don't care" value. To add this extra possible choice, the TCAM contains two 6T-SRAM bitcells and their respective programming circuits, although no additional hitlines are added. FIG. 3 discloses a TCAM bitcell 300. Bitcell 300 contains two 6T-SRAM bitcells 302A, 302B, but only one comparison circuit 304 and associated hitlines HBL, /HBL. Table 1 below shows the possible values for BCAM cells, while Table 2 shows possible values for TCAM cells.

TABLE 1

| BCAM | | |
|---|---|---|
| BL | /BL | Cell Value |
| 0 | 1 | 0 |
| 1 | 0 | 1 |

TABLE 2

| TCAM | | | | |
|---|---|---|---|---|
| BL1 | /BL1 | BL2 | /BL2 | Cell Value |
| 0 | 1 | 0 | 1 | 0 |
| 0 | 1 | 1 | 0 | Don't care |
| 1 | 0 | 0 | 1 | Not used |
| 1 | 0 | 1 | 0 | 1 |

As discussed previously, a binary CAM has only two values and will either match or not match against the hitlines. In the ternary CAM, there are four possible combinations of values shown by the bitline, although one of the possible values, with both BL1 and /BL2 high, is not used. When both BL1 and /BL2 are low, this signals a "don't care" value, which will show as a match against any value. This allows some portions of a pattern to be ignored while other portions are compared.

Problems Encountered in Designing TCAM Layouts

As we have seen in the previous drawings, in order to provide storage and comparison circuits for a single bit in TCAM, the design uses four PMOS transistors, twelve NMOS transistors, two power supply lines, a wordline, a matchline four bitlines and two hitlines. For some CAM applications it is also desirable to allow multiple matchline "channels" to pass through each cell in order to allow additional functions, such as prioritization. An array of these cells can take up a great deal of space, so minimizing the required space is a must.

Additionally, the cell aspect ratio (i.e., width to length ratio) needs to be carefully selected so that the necessary wiring uses the least possible number of metal layers for routing over memory at the chip level. Because of the simultaneous search of every bit, CAMs also draw significant amount of current during operation. A very robust power net is therefore essential to proper operation, especially in embedded applications where localized power droops need to be avoided. Finally, for deep submicron (DSM) process technologies, other factors, such as manufacturability and robustness need to be taken into account as well. The above-mentioned reasons therefore call for a judicious selection of the best suitable CAM bitcell layout architecture that addresses the needs mentioned.

Prior Art Solutions

In order to use similar layouts for both binary and ternary CAM cells, current implementations generally make use of a symmetric 6T-SRAM-layout architecture. This allows comparison circuit 202 to be easily connected to both the true internal node 206 and the complementary internal node 208 of the cell 204, as required for binary CAM cells 200 in FIG. 2. FIG. 3 indicates that a ternary CAM is built from two schematically identical 6-T SRAM bitcells 302A and 302B. The prior art layout of bitcell 202/302B is shown in FIG. 4A. This figure shows the symmetric active areas and polysilicon lines for the 6T SRAM 402 and the comparison circuit 404, which is connected to the true internal node. FIG. 4B shows the metal-1 and metal-2 layers for the same device layouts. In FIG. 4A, 6T-SRAM cell 402 is composed of P-type implant regions 406, N-type implant regions 408, 412, and polysilicon gate lines 420, 422, and 424. N-type implant region 412 is used for the NWELL connection. Furthermore, comparison circuit 404 contains N-type implant regions 410 and polysilicon gate lines 426 and 428. Contacts 430–458 from the gates and/or diffusion areas to metal 1 are also shown. FIG. 4B discloses the metal-1 layer, which includes segments 480–494 and the metal-2 layer, which includes segments 470–478; it additionally repeats contacts 430–478 to help provide reference between the two drawings. Here, metal 1 segment 480 is used for VDD power connection and segment 486 is used for VSS connection. Furthermore, metal 1 segment 482 represents the true and segment 484 the complementary internal node of the 6T-SRAM cell. Metal 2 segments 470 and 471 represent the bitlines of the 6T-SRAM cell, while segment 476 represents one of the hitlines of comparison circuit 304 in FIG. 3. Comparing FIG. 4A to the circuit of FIG. 3, gatelines 420, 422 form the gates for transistors P1B, N2B, P2B, N4B, and gateline 424 forms the gates for transistors N1B and N3B. Contacts 438, 440 provide the nodes by which these segments are connected to the internal nodes of the 6T-SRAM cell. Contact 454 connects transistor gates N1B and N3B to the wordline. Contact 452 connects to bitline 470 (BL or BL2), while contact 456 connects to the associated (complementary) bitline 471 (/BL or /BL2). Contact 430 provides a connection to Vdd, which is carried in metal-1 segment 480, while contacts 444, 448 make the connection to Vss metal-1 segment 486. Metal-1 segment 482 ties contacts 432, 440, 442 together to form one of the internal nodes, while segment 420 similarly ties contacts 434, 438, 446 together in another internal node. Within comparison circuit 404, contact 448 is connected to Vss, carried in metal-2 474, and 450 carries matchline ML. Gatelines for transistors N7 and N8 or for N7B and N8B are carried by segment 426, which is connected through contact 458 to /HBL 476, and by gateline 428.

We have discussed how the assembly of building blocks for 6-T SRAM bitcell 402 and comparison circuit 404 forms ternary CAM subblocks 302B. Comparing schematics of binary CAM 200 of FIG. 2 with ternary CAM 300 of FIG. 3, it becomes clear to those skilled in the art that each individual portion 302A or 302B can form a binary cell 200 by either adding transistors N7A and N8A to portion 302A, or transistors N5B and N6B to portion 302B. Hence, assembly of building blocks 402 and 404 can be used to make either a binary CAM array or a ternary CAM array, as will be shown in the following figures. Showing only the substrate level and gatelines, FIG. 5A discloses two BCAM bitcells as they would be laid out for an array. Each BCAM bitcell 500 contains one 6-T SRAM bitcell 504 and two comparison circuits 502. FIG. 5B discloses the same layouts used to form two TCAM bitcells as laid out for an array. Here, each TCAM bitcell 500' contains two 6-T SRAM bitcells 504 and two comparison circuits 502.

Of interest when the above layout is used in ternary CAM, the 6T-SRAM layout has its bitline connections 452, 456 and bitlines 470, 471 facing the outside border of the SRAM cell and has connection 444 to ground line Vss inside the cell, affecting the ease of contacting this common node. With connections to the bitlines 452, 456 and internal node connections 432, 434, 442, 446 facing the outside of the bitcell, the n-type diffusions for connection circuit transistors N7B, N8B cannot be adjacent to the diffusions for the SRAM n-type transistors. This results in additional island-to-island (i.e., intra-diffusion) spacing requirements that increase the size of the cell without performance benefit. Furthermore, coupling of hitline 476 and bitlines 470, 471 can occur, which can further degrade the performance. An additional disadvantage is the fact that the wordline connection for this prior art, is also placed inside the cell. Therefore, when two SRAM bitcells are used to form a single TCAM bitcell, this results in two separate wordline contacts. This results in additional layout overhead.

SUMMARY OF THE INVENTION

Two new ternary CAM bitcell design options are presented that provide compact layout solutions while, among other advantages, improving density, power routing, and maximizing matchline channel routing through the cells. In both inventive layouts, an asymmetric layout of the 6T-SRAM bitcell is used to improve ease of layout, density, and performance of ternary CAM cells. In addition, the second inventive layout separates the n-type diffusions for the SRAM bitcell and the comparison circuit, creating a bitcell having a more even cell aspect ratio, which allows for additional matchline routing.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 1 shows a circuit diagram for a known 6-T SRAM bitcell.

FIG. 2 shows a circuit diagram for a known BCAM bitcell.

FIG. 3 shows a circuit diagram for a known TCAM bitcell.

FIG. 4A shows the substrate and polysilicon levels and FIG. 4B shows the metal-1 and metal-2 levels of a layout design for a known 6-T SRAM bitcell and comparison circuit for a CAM cell.

FIG. 5A shows the substrate and polysilicon levels of two bitcells of a known BCAM array.

FIG. 5B shows the substrate and polysilicon levels of two bitcells of a known TCAM array.

FIG. 6A shows the substrate and polysilicon levels and FIG. 6B shows the metal-1 and metal-2 levels of two bitcells of TCAM, according to a first embodiment of the invention.

FIG. 6C shows the layout for two back-to-back TCAM bitcells in an array, according to the first embodiment.

FIG. 7A shows the substrate and polysilicon levels and FIG. 7B shows the metal-1 and metal-2 levels of two bitcells of TCAM, according to a second embodiment of the invention. FIG. 7C shows the layout for two back-to-back TCAM bitcells in an array, according to the second embodiment.

DETAILED DESCRIPTION

The specific layouts for a ternary content-addressable memory bitcell will now be disclosed with reference to their associated drawings.

FIRST EMBODIMENT

A first embodiment of the novel TCAM layout will now be discussed with reference to FIG. 6A, which shows the active (diffusion) areas of the substrate and the polysilicon gate lines, and to FIG. 6B, which shows the metal-1 and metal-2 levels of bitcell 600. FIG. 6A is divided into SRAM bitcell regions 602A, 602B and comparison circuit regions 604. In FIG. 6A, there are three p-type active areas 603, 605, 606 and three n-type active areas 608, 610, 612, with p-type active areas 603, 605, 606 extending across the top of bitcell 600, while the larger n-type active areas 608, 610, 612 extend across the bottom portion of bitcell 600. A transistor is formed wherever one of polysilicon gate lines 613, 614, 616, 618, 620, 622, 624 crosses an active area. In FIG. 6A, each of the transistors for the ternary bitcell 600 is indicated by labeling its gate, i.e., the point where its specific gate line crosses an active area, with the identification of the transistor, following the same transistor numbering as was used in FIG. 3. In FIG. 6B, the metal-1 layer contains segments 685 through 699. In this layout, Vdd 685 runs horizontally entirely in metal-1 and contacts the substrate at 630, 638, 648 (see FIG. 6A). Vss, is carried both vertically in the metal-2 layer, and horizontally in segment 686 of metal-1 and reaches the substrate through contacts 656, 662, 668. Vss horizontal metal-1 segment 686 intersects vertical metal-2 Vss lines at metal-1-to-metal-2 vias 656A and 668A. Internal nodes are connected by segment 687, which ties together contacts 632, 650, 658, segment 688, which ties together contacts 634, 636, 660, segment 689, which ties together contacts 640, 642, 664, and segment 690, which ties together contacts 644, 652, 666. Wordline WL is carried to metal-2 segment 695A through metal-1-to-metal-2 via 678A, metal-1 segment 695 and contact 678, which connects to gateline 618. Ultimately, WL runs horizontally in metal-3 through a metal-2-to-metal-3 via that can connect anywhere along the metal-2 segment 695A. Complementary pairs of bitlines BL1, /BL1 and BL2, /BL2, as well as hitlines HBL1, HBL2, travel vertically in metal-2 in this layout, descending to contact the substrate at contacts 674, 676, 680, 682 for bitlines BL1, /BL1, BL2, /BL2 and gate lines 614, 624 at contacts 672, 684 for hitlines HBL1, HBL2. Matchline ML connects to metal-2 segment 691A and 699A through metal-1-to-metal-2 vias 654A and 670A, metal-1 segments 691 and 699, and contacts 654 and 670. Ultimately, matchline runs horizontally in metal-3, parallel to wordline WL by connection of metal-2-to-metal-3 vias to metal-2 segments 691A and 699A.

Notably, this layout of the ternary CAM bitcell takes advantage of the nodes necessary to both of the two 6-T SRAM bitcells by sharing Vdd contact 638, Vss contact 662, and wordline contact 678. This was accomplished by placing the contacts for these lines at the outside edge of the SRAM bitcell, where they were available for common use. Additionally, Vss is easily shared between the SRAM bitcell and the comparison circuit through the sharing of the same n-type diffusion. The design for the 6-T SRAM has become asymmetric, which would make it undesirable for use in a BCAM, but which is not a problem in the TCAM cell since one of the internal nodes of each of the two 6T-SRAM cells contained in a TCAM does not need to be attached to a comparison circuit (these are the internal nodes that provide the don't care or not used states). This is shown in the layout in FIG. 6A where no comparison circuit is connected to gates P2A, N4A and P2B, N2B.

As can be also seen from this layout, one of the two PMOS devices that are part of the 6T-SRAM cell is placed above the matchline NMOS devices in order to provide the most compact solution, i.e. to improve density. Good shielding between the bitlines of adjacent cells is provided through wordline WL and excellent shielding between hitlines and bitlines is provided through Vss. The width of this TCAM bitcell is determined essentially by the series of devices in parallel. The number of matchline routes that need to be provided ultimately limits the vertical dimension of the cell. Good power grid is provided through parallel Vss lines in metal-1 and vertical Vss lines in metal-2. Additionally, while the prior art layout shown in FIG. 5A requires four separate n-type active areas separated by three isolation areas, the current layout shown in FIG. 6A requires only three separate n-type active areas, which require only two isolation areas, thus compacting the cell layout and improving density.

FIG. 6C shows two of these innovative TCAM cells 600 as they would be laid out in an array, showing only the substrate and gate levels. Division of cell 600 into SRAM bitcells 602A, 602B and comparison circuits 604 is also shown.

SECOND EMBODIMENT

The novel ternary CAM bitcell layout introduced in the first embodiment may have two shortcomings. For one the active areas form small, enclosed isolation regions which depending on the technology can lead to silicon stress and device failure. Second, and more importantly, the cell width is purely limited by the sequence of NMOS and PMOS devices. While this layout may have advantages in terms of shrinking the height of the cell, this may not be required for applications where multiple matchlines need to feed through each cell, horizontally in metal-3. For these cases it may be more desirable to achieve a taller and narrower cell that still allows a high density. Such a cell 700 is provided here in this second embodiment, which will be discussed with reference to FIG. 7A, which shows the active areas and gate lines of this layout and to FIG. 7B, which shows metal-1 and metal-2 of this layout.

In this embodiment, the n-type diffusions for the NMOS transistors are separated, with the n-type active areas for the comparison circuit formed at the top of the layout as regions 702, 704 and the n-type active area for the SRAM bitcell formed at the bottom as regions 706, 708, 710. Between these two areas of n-type diffusions are the p-type diffusions 712, 714, 716. In this embodiment, wordline WL is formed entirely in polysilicon, forming gateline 734. Additional polysilicon segments form gatelines 720, 722, 724, 732, 752, 754. Looking at the metal layers, Vss is now provided by metal-1, both as vertical and horizontal line, which contacts the substrate at 744, 750, 774, 780, 786. This strong metal-1 mesh may be sufficient to provide the necessary Vss to the TCAM. Hence, metal-2 may free up space for improved performance. Also in metal-1 are segment 741, which helps carry hitline HBL1 from metal-2 to the polysilicon level at contact 740, segment 743, which helps carry hitline HBL2 from metal-2 to the polysilicon level at contact 742, segment 739, which helps carry matchline ML to the substrate at contacts 746, 748, and segment 749, which brings Vdd from metal-2 to contact the substrate at 758, 760, 768. Matchline ML metal-2 segment 739 will ultimately be connected by a metal-2-to-metal-3 via to a horizontal metal-3 line. As customary in 6T-SRAMs, the wordline WL resistance of the horizontal polysilicon line 734 can be reduced by providing a redundant horizontal wordline in metal-3 thus improve the speed, i.e. performance of the cell. This metal-3 line can be connected to polysilicon line 734 at appropriate distances within the array. Segment 745 forms an internal node to connect contacts 752, 756, 776 together; segment 474 forms another internal node that ties contacts 754, 762, 784 together. Similarly, segment 751 ties together contacts 764, 766, 778 and segment 753 ties together contacts 770, 772, 782. The various bitlines are provided connection to the substrate by segment 755, which ties BL1 to contact 788, segment 757, which ties /BL1 to contact 790, segment 759, which ties BL2 to contact 792, and segment 761, which ties /BL2 to contact 794.

FIG. 7C also shows two bitcells from this layout as they would be arranged for an array, showing only the active areas and polysilicon lines.

As can be seen from the layouts of this embodiment, the matchline access transistors of the ternary CAM cell have been moved to the top of the cell. This cell features the following advantages:

A square cell aspect ratio allows for maximized matchline channels through the cell;

A very robust Vss grid in horizontal and vertical direction, all in M1;

A continuous polysilicon wordline for the bitline access transistors.

Since the active areas for the transistors in the comparison circuit are physically separated from the comparison circuit, these regions can be tailored for optimized performance by separately adjusting the threshold voltages of these devices. The Vss grid in metal-1 minimizes ground bounce and local power congestion. Since both horizontal and vertical Vss power is achieved all in metal-1, the metal-2 layer can either be used for additional Vss power routes, for vertical Vdd routes, or even for increasing the performance by optimizing metal-2 signal line widths and spaces to minimize capacitive loading. The enclosed-isolation features in this implementation are more relaxed, hence minimize any silicon stress related risk. Finally, the continuous polysilicon wordline minimizes the total number of contacts needed per CAM bitcell, and thus reduces the defect density related to polysilicon contact defects. If the number of matchline channels through each cell is not fully utilized, some channels can be used for global wordline schemes in multi-bank CAM architectures. This can provide additional power and performance benefits. Finally, the square cell aspect ratio helps arrange the peripheral logic circuitry needed to drive the CAM. Hence, while wide and short CAMs may offer higher CAM bitcell densities, a more square like CAM cell layout can improve the overall CAM density.

The description of the preferred embodiment of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention the practical application to enable others of ordinary skill in the art to understand the invention for various embodiments with various modifications as are suited to the particular use contemplated.

What is claimed is:

1. A ternary content addressable memory (TCAM) bitcell layout, comprising:
    a first SRAM bitcell comprising two p-type transistors and four n-type transistors, said first SRAM bitcell being connected to a wordline, source voltage Vss, drain voltage Vdd, and a first pair of complementary bitlines, such that a first bit is stored in said first SRAM bitcell;
    a second SRAM bitcell comprising two p-type transistors and four n-type transistors, said second SRAM bitcell being connected to said wordline, said first power line, said second power line, and a second pair of complementary bitlines, such that a second bit is stored in said second SRAM bitcell;
    a first comparison circuit comprising two n-type transistors that compares said first bit to a value carried by a first hitline; and
    a second comparison circuit comprising two n-type transistors that compares said second bit to a value carried by a second hitline;
    wherein active areas for said n-type transistors for said first SRAM bitcell and said second SRAM bitcell form three diffusion regions separated by two isolation regions.

2. The TCAM bitcell layout of claim 1, wherein said first SRAM bitcell and said second SRAM bitcell share a first contact and a first diffusion for said wordline, a second contact and a second diffusion for Vss, and a third contact and a third diffusion for Vdd.

3. The TCAM bitcell layout of claim 1, wherein said first pair and said second pair of complementary bitlines are shielded from the bitlines of adjacent cells by said wordline.

4. The TCAM bitcell layout of claim 1, wherein, in a metal layer containing said hitlines and said bitlines, said first hitline is shielded from said first pair of complimentary bitlines by a first line carrying said source voltage Vss and said second hitline is shielded from said second pair of complementary bitlines by a second line carrying said source voltage Vss.

5. The TCAM bitcell layout of claim 1, wherein in each of said first SRAM bitcell and said second SRAM bitcell, a first diffusion for Vss, a second diffusion for Vdd, and a third diffusion for a wordline (WL) are adjacent the outside border of said bitcell layout.

6. The TCAM bitcell layout of claim 1, wherein the layout of said first SRAM bitcell and of said second SRAM bitcell are each asymmetric.

7. The TCAM bitcell layout of claim 1, wherein said layout includes parallel Vss lines in metal-1 and vertical Vss lines in metal-2.

8. The TCAM bitcell layout of claim 1, wherein said layout has a cell aspect ratio that is approximately one.

9. The TCAM bitcell layout of claim 1, wherein said layout contains a grid of Vss in both horizontal and vertical directions, said grid being entirely in metal-1.

10. The TCAM bitcell layout of claim 1, wherein said layout contains a continuous polysilicon wordline that is the gate for ones of said n-type transistors that are connected to said bitlines.

11. The TCAM bitcell layout of claim 1, wherein the active areas for said n-type transistors of said first and said second comparison circuits are contiguous with ones of said three diffusion regions.

12. The TCAM bitcell layout of claim 1, wherein the active areas for said n-type transistors of said first and said second comparison circuits are separated from said three diffusion regions and their respective threshold voltages are separately tailored.

13. A ternary content addressable memory (TCAM) bitcell layout, comprising:
   a first SRAM bitcell comprising two p-type transistors and four n-type transistors, said first SRAM bitcell being connected to a wordline, source voltage Vss, drain voltage Vdd, and a first pair of complementary bitlines, such that a first bit is stored in said first SRAM bitcell;
   a second SRAM bitcell comprising two p-type transistors and four n-type transistors, said second SRAM bitcell being connected to said wordline, said first power line, said second power line, and a second pair of complementary bitlines, such that a second bit is stored in said second SRAM bitcell;
   a first comparison circuit comprising two n-type transistors that compares said first bit to a value carried by a first hitline; and
   a second comparison circuit comprising two n-type transistors that compares said second bit to a value carried by a second hitline;
   wherein said first SRAM bitcell and said second SRAM bitcell share a first contact for said wordline, a second contact for Vss, and a third contact for Vdd.

14. The TCAM bitcell layout of claim 13, wherein, in a metal layer containing said hitlines and said bitlines, said first hitline is shielded from said first pair of complimentary bitlines by a first line carrying said source voltage Vss and said second hitline is shielded from said second pair of complementary bitlines by a second line carrying said source voltage Vss.

15. The TCAM bitcell layout of claim 13, wherein the bitcell layout has a cell aspect ration of approximately two.

16. The TCAM bitcell layout of claim 13, wherein said layout includes parallel Vss lines in metal-1 and vertical Vss lines in metal-2.

17. A ternary content addressable memory (TCAM) bitcell layout, comprising:
   a first SRAM bitcell comprising two p-type transistors and four n-type transistors, said first SRAM bitcell being connected to a wordline, source voltage Vss, drain voltage Vdd, and a first pair of complementary bitlines, such that a first bit is stored in said first SRAM bitcell;
   a second SRAM bitcell comprising two p-type transistors and four n-type transistors, said second SRAM bitcell being connected to said wordline, said first power line, said second power line, and a second pair of complementary bitlines, such that a second bit is stored in said second SRAM bitcell;
   a first comparison circuit comprising two n-type transistors that compares said first bit to a value carried by a first hitline; and
   a second comparison circuit comprising two n-type transistors that compares said second bit to a value carried by a second hitline;
   wherein active areas for said p-type transistors lie between active areas for n-type transistors for said first and second SRAM bitcells and active areas for n-type transistors for said first and second comparison circuits.

18. The TCAM bitcell layout of claim 17, wherein said layout has a cell aspect ratio that is approximately one.

19. The TCAM bitcell layout of claim 17, wherein said layout contains a grid of Vss in both horizontal and vertical directions, said grid being entirely in metal-1.

20. The TCAM bitcell layout of claim 17, wherein said first SRAM bitcell and said second SRAM bitcell share a first contact for Vss, a second contact for Vdd, and a continuous polysilicon wordline.

* * * * *